(12) United States Patent
Lin et al.

(10) Patent No.: US 10,679,949 B2
(45) Date of Patent: Jun. 9, 2020

(54) SEMICONDUCTOR PACKAGE ASSEMBLY WITH REDISTRIBUTION LAYER (RDL) TRACE

(71) Applicant: MEDIATEK INC., Hsin-Chu (TW)

(72) Inventors: Sheng-Mou Lin, Hsinchu (TW); Duen-Yi Ho, New Taipei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/411,077

(22) Filed: Jan. 20, 2017

(65) Prior Publication Data
US 2017/0263570 A1    Sep. 14, 2017

Related U.S. Application Data

(60) Provisional application No. 62/306,659, filed on Mar. 11, 2016.

(51) Int. Cl.
*H01L 23/552* (2006.01)
*H01L 25/065* (2006.01)
(Continued)

(52) U.S. Cl.
CPC ...... *H01L 23/552* (2013.01); *H01L 23/49838* (2013.01); *H01L 23/5286* (2013.01); *H01L 24/16* (2013.01); *H01L 25/0655* (2013.01); *H01L 25/0657* (2013.01); *H01L 25/18* (2013.01); *H01L 2224/0401* (2013.01); *H01L 2224/04042* (2013.01); *H01L 2224/05554* (2013.01); *H01L 2224/131* (2013.01); *H01L 2224/13147* (2013.01); *H01L 2224/16227* (2013.01); *H01L 2224/32145* (2013.01); *H01L 2224/32225* (2013.01); *H01L 2224/48091* (2013.01); *H01L 2224/48227* (2013.01); *H01L 2224/73253* (2013.01); *H01L 2224/73265* (2013.01); *H01L 2225/0651* (2013.01); *H01L 2225/06517* (2013.01); *H01L 2225/06527* (2013.01); *H01L 2225/06558* (2013.01);
(Continued)

(58) Field of Classification Search
None
See application file for complete search history.

(56) References Cited

U.S. PATENT DOCUMENTS 5,994,766 A  *  11/1999  Shenoy .............. H01L 23/5225
                                                                 257/659
8,508,046 B2      8/2013   Sakuma et al.
(Continued)

FOREIGN PATENT DOCUMENTS

CN           102484101 A       5/2012

*Primary Examiner* — Davienne N Monbleau
*Assistant Examiner* — Scott R Wilson
(74) *Attorney, Agent, or Firm* — Wolf, Greenfield & Sacks, P.C.

(57) ABSTRACT

The invention provides a semiconductor package assembly. The semiconductor package assembly includes a substrate having a first pad and a second pad thereon. A logic die is mounted on the substrate. The logic die includes a first logic die pad coupled to the first pad. A memory die is mounted on the substrate. The memory die includes a first memory die pad. A first redistribution layer (RDL) trace has a first terminal and a second terminal. The first terminal is coupled to the first pad through the first memory die pad. The second terminal is coupled to the second pad rather than the first pad.

21 Claims, 7 Drawing Sheets

(51) Int. Cl.
*H01L 23/498* (2006.01)
*H01L 23/00* (2006.01)
*H01L 25/18* (2006.01)
*H01L 23/528* (2006.01)

(52) U.S. Cl.
CPC .............. *H01L 2225/06568* (2013.01); *H01L 2924/1431* (2013.01); *H01L 2924/1432* (2013.01); *H01L 2924/1434* (2013.01); *H01L 2924/1436* (2013.01); *H01L 2924/15192* (2013.01); *H01L 2924/15311* (2013.01); *H01L 2924/181* (2013.01); *H01L 2924/3025* (2013.01)

(56) References Cited

U.S. PATENT DOCUMENTS

| | | |
|---|---|---|
| 2005/0253278 A1 | 11/2005 | Lam et al. |
| 2007/0187814 A1 | 8/2007 | Cusack et al. |
| 2009/0004781 A1* | 1/2009 | Liao .................... H01L 21/6835 438/118 |
| 2011/0254145 A1* | 10/2011 | Kim ........................ H01L 24/49 257/686 |
| 2012/0193799 A1* | 8/2012 | Sakuma .............. H01L 23/4951 257/770 |
| 2014/0185264 A1* | 7/2014 | Chen .................... H01L 23/3128 361/814 |
| 2014/0191376 A1 | 7/2014 | Huang et al. |
| 2014/0247634 A1 | 9/2014 | Takizawa |
| 2015/0206855 A1* | 7/2015 | Lin .................... H01L 23/5286 257/738 |
| 2015/0318264 A1 | 11/2015 | Yu et al. |

\* cited by examiner

SEMICONDUCTOR PACKAGE ASSEMBLY WITH REDISTRIBUTION LAYER (RDL) TRACE

CROSS REFERENCE TO RELATED APPLICATIONS

This application claims the benefit of U.S. Provisional Application No. 62/306,659 filed Mar. 11, 2016, the entirety of which is incorporated by reference herein.

BACKGROUND OF THE INVENTION

Field of the Invention

The present invention relates to a semiconductor package assembly, and in particular to a memory die integrated into a system-in-package (SIP) package assembly.

Description of the Related Art

In order to ensure miniaturization and multi-functionality of electronic products and communication devices, it is desired that semiconductor packages be small in size, to support multi-pin connection, high speeds, and high functionality. The multi-functional system-in-package (SIP) package usually requires integrating discrete logic dies and memory dies. The memory die usually uses a redistribution layer (RDL) ground trace with a long length for the connection between the memory die and the logic die. In the design of a system-in-package (SIP) package for radio frequency (RF) applications, however, the long redistribution layer (RDL) ground trace causes the undesired signal integrity problem and noise coupling problem.

Thus, a novel semiconductor package assembly is desirable.

BRIEF SUMMARY OF THE INVENTION

An exemplary embodiment of a semiconductor package assembly is provided. The semiconductor package assembly includes a substrate having a first pad and a second pad thereon. A logic die is mounted on the substrate. The logic die includes a first logic die pad coupled to the second pad. A memory die is mounted on the substrate. The memory die includes a first memory die pad. A first redistribution layer (RDL) trace has a first terminal and a second terminal. The first terminal is coupled to the first pad through the first memory die pad. The second terminal is coupled to the second pad rather than the first pad.

Another exemplary embodiment of a semiconductor package assembly includes a substrate having a first pad and a second pad thereon. A memory die having a first side and a second side is mounted on the substrate. The memory die includes a memory die pad close to the first side and coupled to the first pad. A redistribution layer (RDL) trace has a first terminal close to the first side and a second terminal close to the second side. The first terminal is coupled to the first pad through the memory die pad. The second terminal is coupled to the second pad close to the second side through a first single conductive routing. A logic die is mounted on the substrate. The logic die includes a logic die pad close to the second side and coupled to the second pad.

Yet another exemplary embodiment of a semiconductor package assembly includes a substrate having a first ground pad and a second ground pad thereon. A memory die is mounted on the substrate. The memory die includes a memory ground pad coupled to the first ground pad. A redistribution layer (RDL) ground trace has a first terminal and a second terminal. The first terminal is coupled to the first ground pad through a first conductive path including the memory ground pad. The second terminal is coupled to the second ground pad through a second conductive path that is not coupled to the memory ground pad. A logic die is mounted on the substrate. The logic die includes a logic ground pad coupled to the second terminal through the second ground pad.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
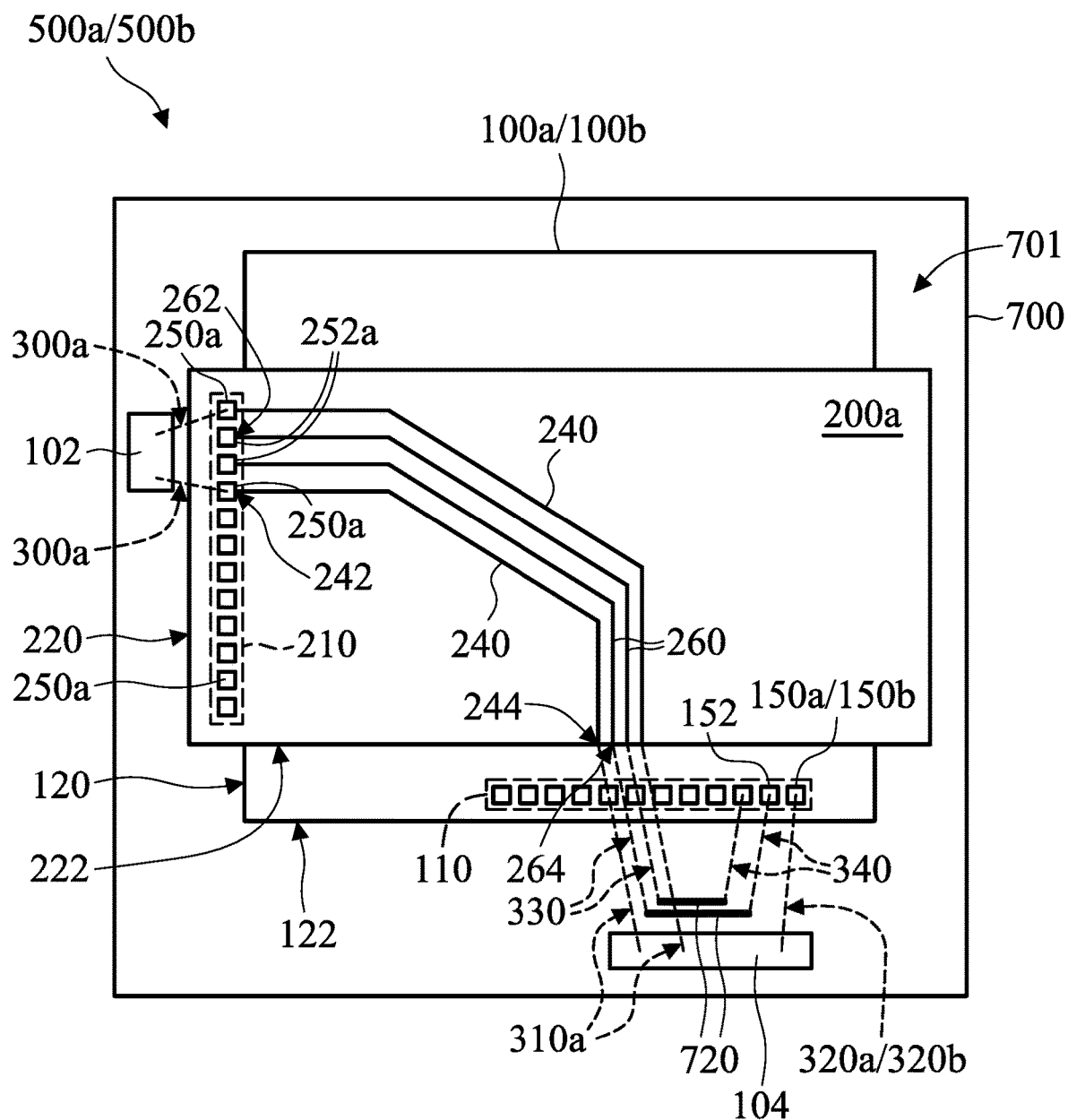
FIG. 1 is a plan view of a semiconductor package assembly in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Embodiments provide a semiconductor package assembly. The semiconductor package assembly is a system-in-package (SIP). The semiconductor package assembly includes at least a logic die and at least a memory die. The memory die includes a redistribution layer (RDL) ground trace with two terminals opposite to each other. One of the two terminals is designed to be close to and to be coupled to the ground pad of the memory die. The other of the two terminals of the redistribution layer (RDL) ground trace is used as a ground pad of the logic die. The semiconductor package assembly is designed to add grounding points at the two terminals of the redistribution layer (RDL) ground trace to avoid the potential different between the two terminals of the RDL ground trace with a long length. Also, the additional grounding points for the RDL ground trace can reduce radio frequency (RF) interference due to the long RDL ground trace.

Figure 3:
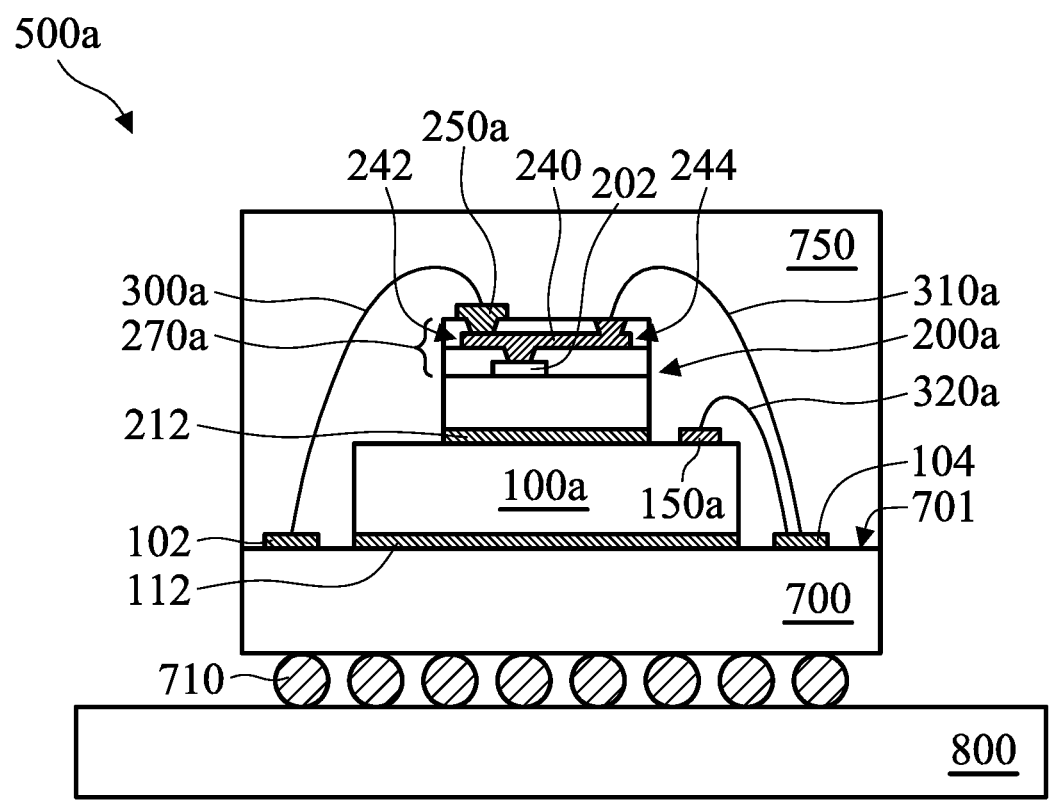
FIGS. 3-4 are cross-sectional views of FIG. 1, showing the arrangements of the substrate, the logic die, the memory die and the redistribution layer (RDL) ground trace of the memory die of the semiconductor package assembly shown in FIG. 1.
Figure 4:
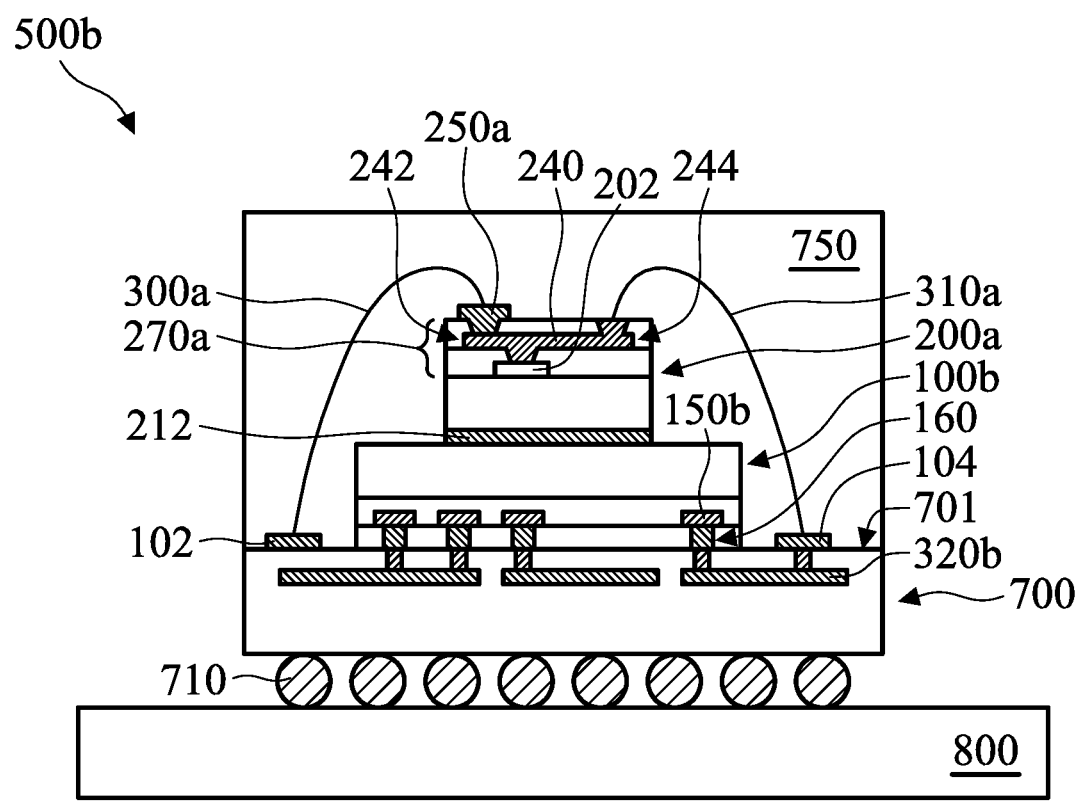

FIG. 1 is a plan view of semiconductor package assemblies 500a and 500b in accordance with some embodiments of the disclosure. FIGS. 3-4 are cross-sectional views of FIG. 1, showing the arrangements of the substrate, the logic die, the memory die and the redistribution layer (RDL) ground trace of the memory die of the semiconductor package assembly shown in FIG. 1. For clearly showing the arrangement of the substrate, the logic die, the memory die and the redistribution layer (RDL) ground trace of the memory die of the semiconductor package assemblies 500a and 500b, a molding compound is not shown in FIG. 1.

As shown in FIGS. 1 and 3, the semiconductor package assembly 500a is mounted on a base 800 through a plurality of conductive structures 710. In some embodiments, the semiconductor package assembly 500a serves as a system-in-package (SIP). In some embodiments, the base 800 may include a printed circuit board (PCB). The conductive structures 710 may include conductive bump structures such as copper bumps, solder ball structures, solder bump structures, conductive pillar structures, conductive wire structures, or conductive paste structures. The semiconductor package assembly 500a includes a substrate 700, a semiconductor die (logic die) 100a, a semiconductor die (memory die) 200a and a redistribution layer (RDL) ground trace 240 of the memory die 200a. It should be noted that the substrate 700, the logic die 100a and the memory die 200a are discrete, individual elements of the semiconductor package assembly 500a.

As shown in FIGS. 1 and 3, a substrate 700 is provided. The substrate 700 includes a die-attached surface 701 for the logic die 100a and the memory die 200a mounted thereon. The substrate 700 includes several discrete ground pads 102 and 104 disposed close to the die-attached surface 701. In some embodiments, the ground pads 102 and 104 are used for input/output (I/O) connections to ground. Therefore, the ground pads 102 and 104 also serve as ground pads of the substrate 700. The substrate 700 may also include an interconnection (not shown) formed therein to be coupled to the ground pads 102 and 104. In some embodiments, the substrate 700 may comprise a semiconductor substrate, such as a silicon substrate. In some other embodiments, the substrate 700 may comprise a dielectric material such as an organic material. In some embodiments, the organic material includes polypropylene (PP) with glass fiber, epoxy resin, polyimide, cyanate ester, other suitable materials, or a combination thereof.

As shown in FIGS. 1 and 3, the semiconductor die 100a is disposed on the substrate 700. The semiconductor die 100a may be mounted on the die-attached surface 701 of the substrate 700 through an adhesive 112 (for example, paste) between the semiconductor die 100a and the substrate 700. In some embodiments, the semiconductor die 100a is coupled to the substrate 700 through wire bonding technology. In some embodiments, and as shown in FIG. 3, the semiconductor die 100a is coupled to the substrate 700 through conductive structures comprising conductive wires, for example, a conductive wire 320a. In some embodiments, the semiconductor die 100a may serve as a logic die 100a including a central processing unit (CPU), a graphics processing unit (GPU), a dynamic random access memory (DRAM) controller, or any combination thereof.

As shown in FIGS. 1 and 3, the semiconductor die 200a is stacked and mounted directly on the semiconductor die 100a through an adhesive 212 (for example, paste) between the semiconductor dies 100a and 200a. In some embodiments, the semiconductor die 200a may serve as a memory die 200a, for example, a dynamic random access memory (DRAM) die. In some embodiments, the semiconductor die 200a is coupled to the substrate 700 through the wire bonding technology. As shown in FIG. 3, the semiconductor die 200a is coupled to the substrate 700 through conductive structures comprising conductive wires, for example, conductive wires 300a and 310a.

As shown in FIGS. 1 and 3, the memory die 200a may comprise a memory I/O die pad 202 and a redistribution layer (RDL) structure 270a on the memory I/O die pad 202 of the memory die 200a. In some embodiments, the memory die 220a may be a DRAM die or multiple DRAM dies. The RDL structure 270a may comprise at least a redistribution layer (RDL) trace 240 and at least a pad 250a. The RDL trace 240 and the pad 250a are used for input/output (I/O) connections to ground. In some embodiments as shown in FIG. 3, the RDL trace 240 serves as a RDL ground trace 240. The RDL trace 240 is designed to be positioned at a single layered-level of the RDL structure 270a. In some embodiments as shown in FIG. 3, the pad 250a is disposed within an input/output (I/O) pad region 210 and on the top of the RDL structure 270a. The pad 250a serves as a ground pad of the memory die 200a.

The RDL trace 240 is used to fan out or re-route the ground path of the memory I/O die pad 202 from the position of the pad 250a to a specific position (for example, the specific position is close to an input/output (I/O) pad region 110 of the logic die 100a). The RDL ground trace 240 of the memory die 200a may have a long length. As shown in FIGS. 1 and 3, the RDL ground trace 240 of the memory die 200a is designed to be extended from a first side 220 to a second side 222 of the memory die 200a for the connection between the memory die 200a and the logic die 100a. The RDL ground trace 240 has a first terminal 242 and a second terminal 244 away from the first terminal 242. The first terminal 242 is coupled to the pad 250a close thereto. The pad 250a of the memory die 200a is coupled to the ground pad 102 of the substrate 700 close thereto. In some embodiments, the first terminal 242 of the RDL ground trace 240 and the pad 250a of the memory die 200a are both arranged to be close to the first side 220 of the memory die 200a. The ground pad 102 of the substrate 700 is arranged close to the first side 220 of the memory die 200a. Also, the ground pad 102 of the substrate 700 is arranged close to the pad 250a of the memory die 200a to reduce the ground path from the memory die 200a to the substrate 700.

As shown in FIGS. 1 and 3, the pad 250a of the memory die 200a is coupled to the ground pad 102 through a conductive routing 300a, for example, a bonding wire. It should be noted that the conductive routing 300a is a single bonding wire which has two terminals in contact with the pad 250a and the ground pad 102, respectively. The conductive routing 300a is not in contact with the ground pad 104.

As shown in FIGS. 1 and 3, the second terminal 244 of the RDL ground trace 240 is coupled to a ground pad of the substrate 700, for example, the ground pad 104, rather than the ground pad 102. The second terminal 244 of the RDL ground trace 240 is coupled to the ground pad 104 without using the pad 250a and the ground pad 102. In some embodiments, the second terminal 244 of the RDL ground trace 240 and the ground pad 104 are both arranged close to the second side 222 of the memory die 200a. The first side 220 and the second side 222 are different sides of the memory die 200a. The second terminal 244 of the RDL ground trace 240 is coupled to the ground pad 104 through a conductive routing 310a, for example, a bonding wire. It should be noted that the conductive routing 310a is a single bonding wire which has two terminals in contact with the second terminal 244 and the ground pad 104, respectively. The single conductive routing 310a is not in contact with the ground pad 102 and the conductive routing 300a.

As shown in FIGS. 1 and 3, the logic die 100a may comprise a logic device (not shown) and a redistribution layer (RDL) structure (not shown) on the logic device. The redistribution layer (RDL) structure of the logic die 100a may comprise at least a redistribution layer (RDL) trace and at least a pad 150a, which is used to transmit a ground signal from the logic device. In some embodiments as shown in FIG. 3, the pad 150a is disposed on the top of the RDL structure. The pad 150a is disposed within an input/output (I/O) pad region 110 of the logic die 100a. The pad 150a serves as a ground pad of the logic die 100a.

As shown in FIGS. 1 and 3, the pad 150a of the logic die 100a is coupled to the ground pad 104 of the substrate 700 only through a conductive routing 320a, for example, a bonding wire. In some embodiments, the pad 150a of the logic die 100a is not coupled to the ground pad 102 of the substrate 700. The conductive routings 300a, 310a and 320a are different conductive routings. That is to say, the conductive routing 320a is not in contact with the conductive routings 300a and 310a.

The RDL structure 270a of the semiconductor die 200a as shown in FIG. 3 may comprise a second redistribution layer (RDL) trace 260 and at least a pad 252a coupled to the second RDL trace 260, as shown in FIG. 1. In some embodiments, as shown in FIG. 1, the second RDL trace 260 is arranged close to and parallel to the RDL ground trace 240. Similar to the RDL ground trace 240, the second RDL trace 260 of the memory die 200a may have a long length. The second RDL trace 260 of the memory die 200a is designed to be extended from the first side 220 to the second side 222 of the memory die 200a.

The second RDL trace 260 and the pad 252a are used for input/output (I/O) connections to signals of the memory I/O die pad 202. The second RDL trace 260 may serve as a RDL signal trace. The second RDL trace 260 is not coupled to the ground pads 102 and 104 of the substrate 700. In some embodiments, the pad 252a is also disposed on the top of the RDL structure (for example, the RDL structure 270a as shown in FIG. 3). The pad 252a serves as a signal pad of the memory die 200a. The pad 252a is located within the input/output (I/O) pad region 210. Also, the pad 252a is close to the pad 250a and isolated from the pad 250a.

As shown in FIG. 1, the second RDL signal trace 260 has a third terminal 262 and a fourth terminal 264 away from the third terminal 262. The third terminal 262 of the second RDL signal trace 260 is located close to the first terminal 242 of the RDL ground trace 240. Also, the fourth terminal 264 of the second RDL signal trace 260 is located close to the second terminal 244 of the RDL ground trace 240. The third terminal 262 is coupled to the pad 252a close thereto. The pad 252a of the memory die 200a is coupled to the corresponding signal pad (not shown) of the substrate 700. The fourth terminal 264 of the second RDL signal trace 260 is coupled to a pad 152 of the logic die 100a through conductive routings 330, 340 and a conductive structure 720 of the substrate 700. In some embodiments, the conductive routings 330 and 340 may comprise bonding wires. The conductive structure 720 of the substrate 700 may comprise circuitries and pads.

In some embodiments as shown in FIG. 1, the pad 152 of the logic die 100a is located close to the pad 150a and is electrically isolated from the pad 150a. The pad 152 may serve as a signal pad of the logic die 100a.

As shown in FIG. 3, the semiconductor package assembly 500a further includes a molding compound 750 surrounding the logic die 100a, the memory die 200a and the conductive routings, which include the conductive routings 300a, 310a and 320a. The molding compound 750 is in contact with the logic die 100a, the memory die 200a and the conductive routings 300a, 310a and 320a. The molded compound 750 also covers the die-attached surface 701 of the substrate 700. In some embodiments, the molded compound 750 may be formed of a nonconductive material, such as an epoxy, a resin, a moldable polymer, or the like. The molding compound 750 may be applied while substantially liquid, and then may be cured through a chemical reaction, such as in an epoxy or resin. In some other embodiments, the molding compound 750 may be an ultraviolet (UV) or thermally cured polymer applied as a gel or malleable solid capable of being disposed around the logic die 100a and the memory die 200a, and then may be cured through a UV or thermally curing process. The molding compound 750 may be cured with a mold.

FIG. 4 is a cross-sectional view of FIG. 1, showing the arrangements of the substrate, the logic die, the memory die and the redistribution layer (RDL) ground trace of the memory die of a semiconductor package assembly 500b. Elements of the embodiments hereinafter, that are the same or similar as those previously described with reference to FIGS. 1 and 3, are not repeated for brevity. The difference between the semiconductor package assembly 500a and the semiconductor package assembly 500b is that the semiconductor package assembly 500b includes a semiconductor die (logic die) 100b disposed on the substrate 700 through the flip-chip technology. In some embodiments, the semiconductor die 100b may serve as a logic die 100b. The logic die 100b may comprise at least a pad 150b, which is used for input/output (I/O) connections to ground. The pad 150b serves as a ground pad of the logic die 100b. The pad 150b is disposed within an input/output (I/O) pad region 110 of the logic die 100b, as shown in FIG. 1.

As shown in FIG. 4, the logic die 100b is flipped upside-down and is coupled to the substrate 700 through a conductive structure 160. The conductive structure 160 is disposed on the pad 150b. The conductive structure 160b may include at least a conductive bump structure coupled to the corresponding pad 150b. The conductive bump structure may comprise copper bumps or solder bump structures, conductive pillar structures, conductive wire structures, or conductive paste structures. The pad 150b of the logic die 100b is coupled to the to the ground pad 104 of the substrate 700 through an interconnect 320b, for example, circuits, embedded in the substrate 700.

Figure 2:
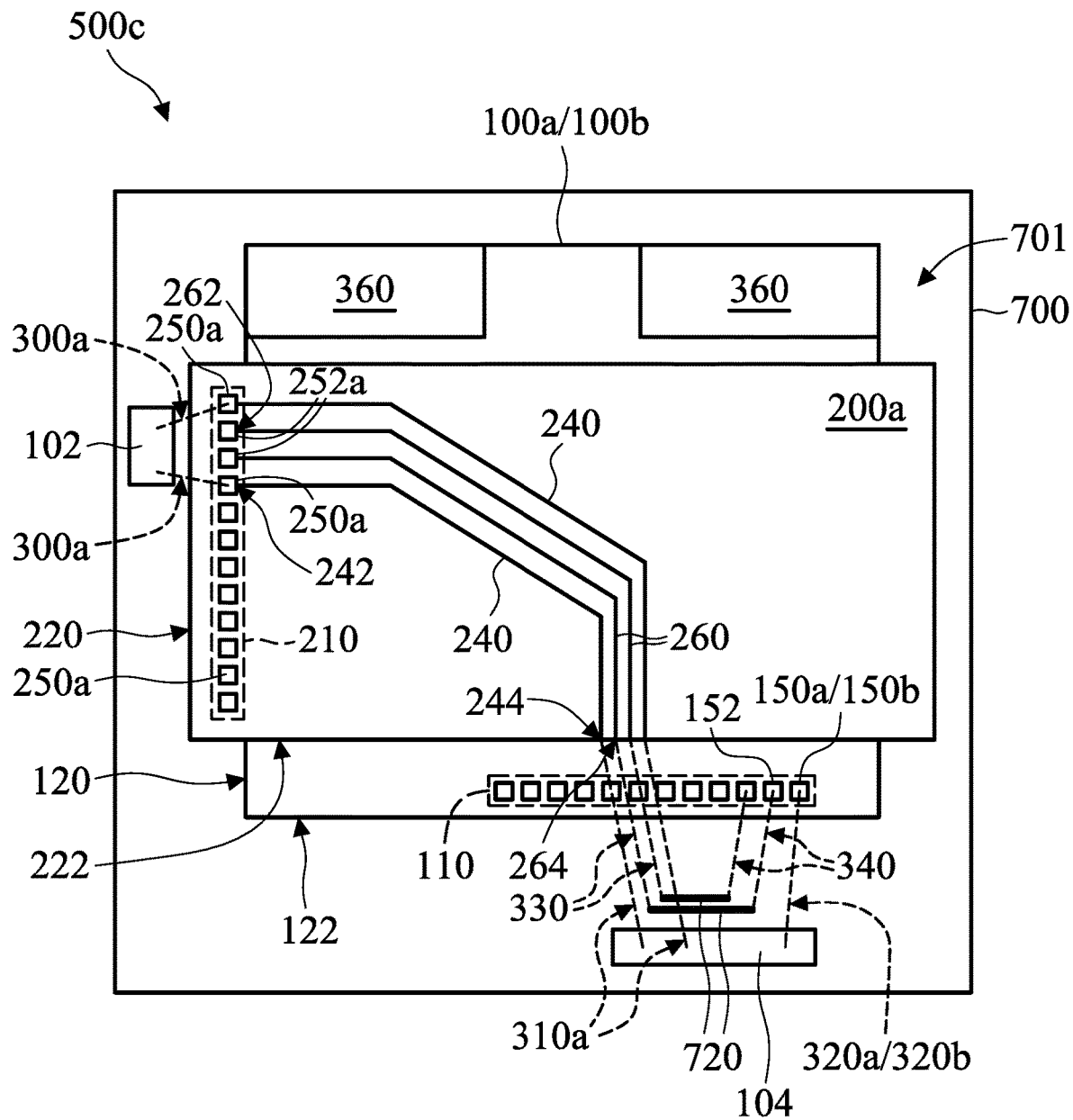
FIG. 2 is a plan view of a semiconductor package assembly in accordance with some embodiments of the disclosure.

FIG. 2 is a plan view of a semiconductor package assembly 500c in accordance with some embodiments of the disclosure. Elements of the embodiments hereinafter, that are the same or similar as those previously described with reference to FIGS. 1, 3 and 4, are not repeated for brevity. The differences between the semiconductor package assembly 500a/500b and the semiconductor package assembly 500c is that the semiconductor die (logic die) 100a/100b of the semiconductor package assembly 500c further includes at least a radio frequency (RF) circuit 360 integrated in the semiconductor die (logic die) 100a/100b for RF applications.

Figure 5:
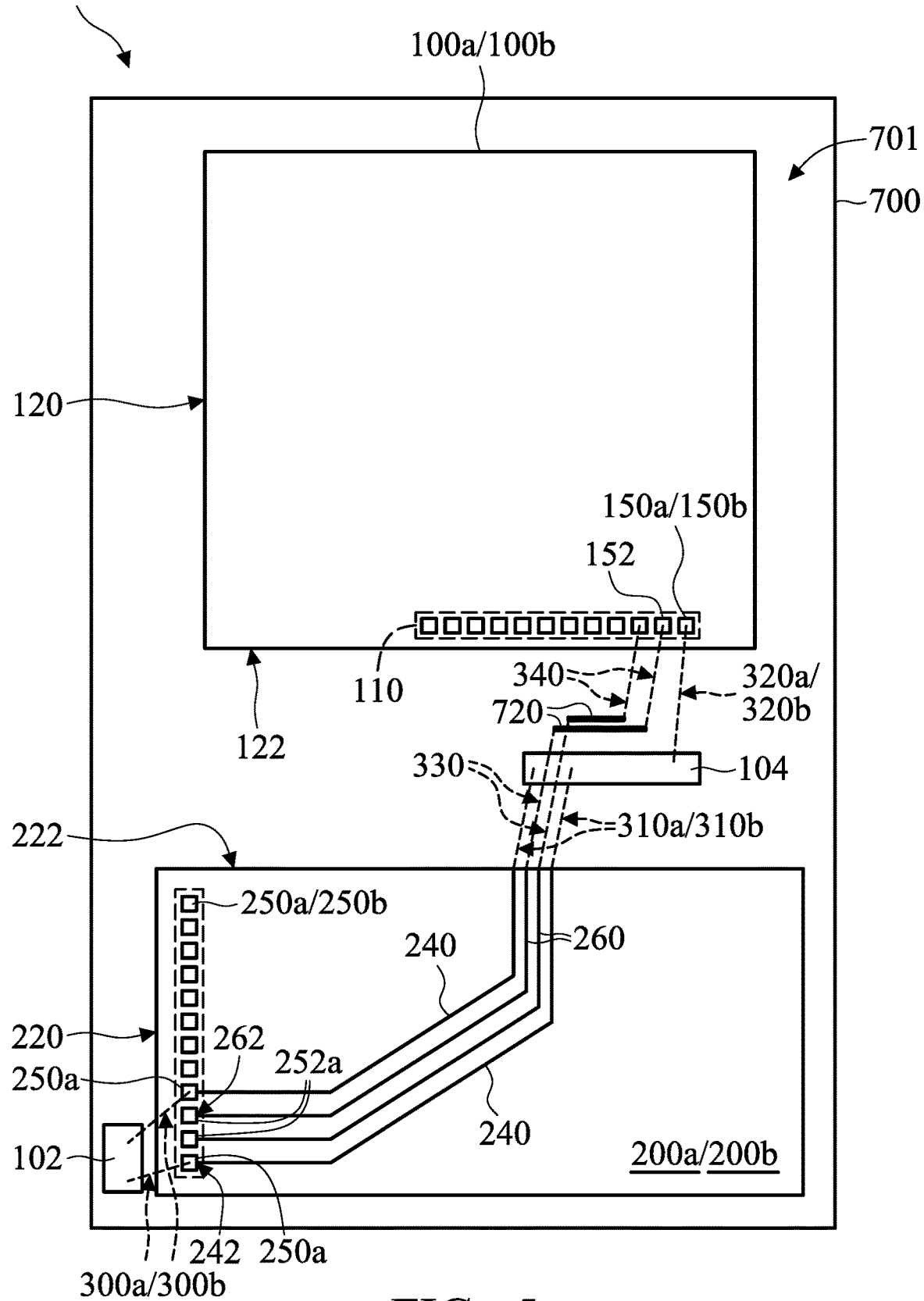
FIG. 5 is a plan view of a semiconductor package assembly in accordance with some embodiments of the disclosure.
Figure 6:
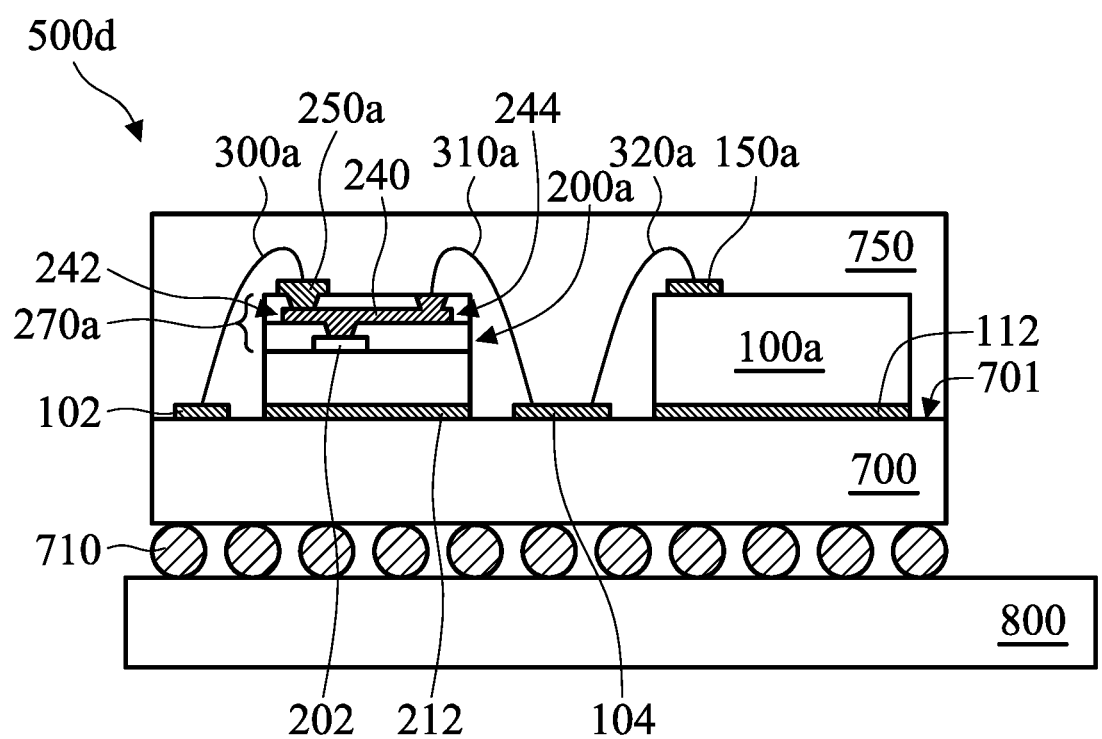
FIGS. 6-7 are cross-sectional views of FIG. 5, showing the arrangements of the substrate, the logic die, the memory die and the redistribution layer (RDL) ground trace of the memory die of the semiconductor package assembly shown in FIG. 5.
Figure 7:
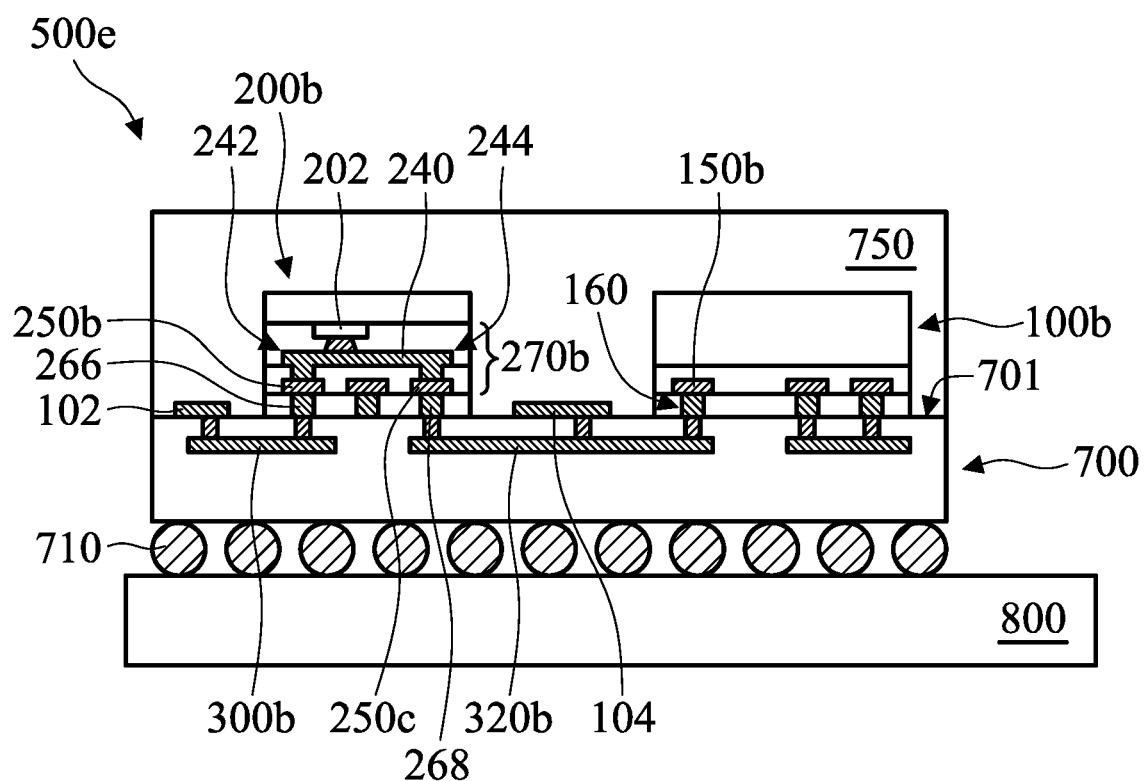

FIG. 5 is a plan view of semiconductor package assemblies 500d and 500e in accordance with some embodiments of the disclosure. FIGS. 6-7 are cross-sectional views of FIG. 5, showing the arrangements of the substrate, the logic die, the memory die and the redistribution layer (RDL) ground trace of the memory die of the semiconductor package assembly shown in FIG. 5. For clearly showing the arrangement of the substrate, the logic die, the memory die and the redistribution layer (RDL) ground trace of the memory die of the semiconductor package assemblies 500d and 500e, a molding compound is not shown in FIG. 5. Elements of the embodiments hereinafter, that are the same or similar as those previously described with reference to FIGS. 1-4, are not repeated for brevity.

As shown in FIGS. 5 and 6, the differences between the semiconductor package assembly 500a/500b (shown in FIGS. 1-3) and the semiconductor package assembly 500d is that the memory die 200a is disposed beside the logic die 100a. Therefore, the memory die 200a and the logic die 100a are mounted on the die-attach surface 701 of the substrate 700 by paste 212 and 112b, respectively.

In some embodiments as shown in FIG. 6, the logic die 100a is coupled to the substrate 700 through the wire bonding technology. The semiconductor die 100a may be mounted on the die-attached surface 701 of the substrate 700 through an adhesive 112 (for example, paste) between the semiconductor die 100a and the substrate 700.

In some embodiments as shown in FIGS. 5 and 6, the first terminal 242 of the RDL ground trace 240, the pad 250a of the memory die 200a and the ground pad 102 of the substrate 700 are arranged close to the first side 220 of the memory die 200a. The second terminal 244 of the RDL ground trace 240, the ground pad 104 and the pad 150a of the logic die 100a are both arranged close to the second side 222 of the memory die 200a. Also, the ground pad 104 is disposed between the logic die 100a and the memory die 200a as shown in FIG. 6.

FIG. 7 is a cross-sectional view of FIG. 5, showing the arrangements of the substrate, the logic die, the memory die and the redistribution layer (RDL) ground trace of the memory die of a semiconductor package assembly 500e. Elements of the embodiments hereinafter, that are the same or similar as those previously described with reference to FIGS. 5-6, are not repeated for brevity. The differences between the semiconductor package assembly 500d and the semiconductor package assembly 500e is that the semiconductor package assembly 500e includes a semiconductor die 100b and a semiconductor die 200b disposed on the substrate 700 through the flip-chip technology. In some embodiments, the semiconductor die 100b serves as a logic die 100b, and the semiconductor die 200b may serve as a memory die 200b.

As shown in FIG. 7, the logic die 100b may comprise at least a pad 150b, which is used for input/output (I/O) connections to ground. The pad 150b serves as a ground pad of the logic die 100b.

The memory die 200b may comprise may comprise a memory I/O die pad 202 and a redistribution layer (RDL) structure 270b on the memory I/O die pad 202. The RDL structure 270b may comprise at least a redistribution layer (RDL) trace 240 and at least two pads 250b and 250c. The RDL trace 240 and the pad 250b and 250c are used for input/output (I/O) connections to ground. In some embodiments as shown in FIG. 7, the RDL trace 240 serves as a RDL ground trace 240. The RDL trace 240 is designed to be positioned at a single layered-level of the RDL structure 270b. The two terminals 242 and 244 of the RDL trace 240 are respectively coupled to the pads 250b and 250c. The pads 250b and 250c serve as ground pads of the memory die 200a. The pad 250b is disposed within the input/output (I/O) pad region 210 as shown in FIG. 5. The pad 250c is disposed outside of the input/output (I/O) pad region 210. For example, the pad 250c is disposed close to the terminal 244 of the RDL trace 240. Also, the pad 250b is designed to be free from being in contact with the pad 250c.

As shown in FIG. 7, the memory die 200b is flipped upside-down and is coupled to the substrate 700 through conductive structures 266 and 268. The conductive structures 266 and 268 are disposed on the pads 250b and 250c, respectively. The conductive structures 266 and 268 may include conductive bump structures coupled to the corresponding pads 250b and 250c. Also, the conductive structure 266 is designed to be free from being in contact with the conductive structure 268. The ground pad 250b of the memory die 200b is coupled to the ground pad 102 of the substrate 700 through the conductive structure 266 and an interconnect 300b. The pad 250c of the memory die 200b is coupled to the to the ground pad 104 of the substrate 700 through the conductive structure 268 and an interconnect 320b embedded in the substrate 700. In some embodiments, the interconnect 300b and 320b are disposed embedded in the substrate 700. The interconnect 300b and 320b may comprise circuits.

As shown in FIG. 7, the logic die 100b is flipped upside-down and is coupled to the substrate 700 through a conductive structure 160. The conductive structure 160 is disposed on the pad 150b. The conductive structure 160 may include at least a conductive bump structure coupled to the corresponding pad 150b. The pad 150b of the logic die 100b is coupled to the to the ground pad 104 of the substrate 700 through the conductive structure 160 and the interconnect 320b of the substrate 700. That is to say, the interconnect 320b electrically connects to the pad 250c of the memory die 200b, the pad 150b of the logic die 100b and the ground pad 104 of the substrate 700. Also, the interconnect 300b and the interconnect 320b are discrete circuits. The interconnect 300b is designed to be free from being in contact with the interconnect 320b.

Embodiments provide a semiconductor package assembly. The semiconductor package assembly includes a substrate, a memory die and a logic die mounted on the substrate. The memory die includes a redistribution layer (RDL) ground trace having a first terminal and a second terminal far away from the first terminal. The first and second terminals are located close to different sides of the memory die. The first terminal of the RDL ground trace is coupled to the first ground pad of the substrate through a first conductive path comprising a pad of the memory die, which is positioned within an input/output (I/O) pad region. The second terminal of the RDL ground trace is coupled to the second ground pad of the substrate through a second conductive path different from the first conductive path. The second conductive path is free from being coupled to the pad of the memory die. The logic die includes a pad coupled to the second terminal of the RDL ground trace through the second ground pad of the substrate.

The semiconductor package assembly is designed to have grounding paths at the two terminals of the redistribution layer (RDL) ground trace of the memory die. When the RDL ground trace of the memory die has a long length, the design of the RDL ground trace can improve signal integrity by reducing the crosstalk problem. When the semiconductor package assembly includes integrated radio frequency (RF) circuits in the logic die for RF applications, the RDL ground trace of the memory die also can improve the RF desense problem by reducing the coupled noise from the circuit of the memory die to the RF circuit of the logic die.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package assembly, comprising:
a substrate having a first pad and a second pad thereon; a logic die mounted on the substrate,
wherein the logic die comprises:
a first logic die pad coupled to the second pad; and a memory die mounted on the logic die, wherein the memory die comprises a first memory die pad; and
a first redistribution layer (RDL) structure mounted on the memory die, wherein the first RDL structure comprises a first RDL trace, having a first terminal and a second terminal, wherein the first pad is coupled to the first terminal through a first wire bond contacting the first memory die pad, and wherein the second terminal is coupled to the second pad through a direct connection of a second wire bond to the second terminal without an intervening memory die pad,
wherein the first pad is positioned along a first lateral side of the memory die, and the second pad is positioned along a second lateral side of the memory die,
wherein the first lateral side is adjacent to the second lateral side,
wherein the first RDL trace is a ground trace and the first RDL structure further comprises a second RDL trace that is a ground trace, and
wherein the first RDL structure further comprises at least one third RDL trace between the first RDL trace and the second RDL trace, the at least one third RDL trace being an I/O trace.

2. The semiconductor package assembly as claimed in claim 1, wherein the first logic die pad is coupled to the second pad through a third wire bond.

3. The semiconductor package assembly as claimed in claim 1, wherein the first pad and the second pad are discrete ground pads.

4. The semiconductor package assembly as claimed in claim 1, wherein the first RDL trace is disposed at a single layered-level.

5. The semiconductor package assembly as claimed in claim 1, wherein the memory die is located directly on the logic die.

6. The semiconductor package assembly as claimed in claim 1, wherein the at least one third RDL trace has a third terminal and a fourth terminal, wherein the third terminal is coupled to a second memory die pad of the memory die, and the fourth terminal is coupled to a second logic die pad of the logic die.

7. The semiconductor package assembly as claimed in claim 6, wherein the at least one third RDL trace is not coupled to the first pad or the second pad.

8. The semiconductor package assembly as claimed in claim 6, wherein the fourth terminal is coupled to the second logic die pad through a conductive structure of the substrate.

9. A semiconductor package assembly, comprising:
a substrate having a first pad and a second pad thereon;
a memory die having a first lateral side and a second lateral side and mounted on the substrate, wherein the memory die comprises a memory die pad positioned along the first lateral side and coupled to the first pad and wherein the first pad is positioned along the first lateral side, the second pad is positioned along the second lateral side, and the first lateral side is adjacent to the second lateral side; and
a first redistribution layer (RDL) structure mounted on the memory die, wherein the first RDL structure comprises:
a first RDL trace, having a first terminal adjacent to the first lateral side and a second terminal adjacent to the second lateral side, wherein the first terminal is coupled to the first pad through a first wire bond contacting the memory die pad, and
wherein the second terminal is coupled to the second pad through a direct connection of a second wire bond to the second terminal without an intervening memory die pad as a first conductive routing; and
a logic die mounted on the substrate, wherein the logic die comprises a logic die pad adjacent to the second lateral side and coupled to the second pad,
wherein the first RDL trace is a ground trace and the first RDL structure further comprises a second RDL trace that is a ground trace, and
wherein the first RDL structure further comprises at least one third RDL trace between the first RDL trace and the second RDL trace, the at least one third RDL trace being an I/O trace.

10. The semiconductor package assembly as claimed in claim 9, wherein the first conductive routing is not in contact with the first pad.

11. The semiconductor package assembly as claimed in claim 10, wherein the memory die pad is coupled to the first pad through a second conductive routing that is not in contact with the first conductive routing.

12. The semiconductor package assembly as claimed in claim 9, wherein the logic die pad is coupled to the second pad through a third conductive routing that is not in contact with the first and second conductive routings.

13. The semiconductor package assembly as claimed in claim 9, wherein the first pad and the second pad are discrete ground pads.

14. The semiconductor package assembly as claimed in claim 9, wherein the first RDL trace is disposed at a single layered-level.

15. The semiconductor package assembly as claimed in claim 9, wherein the memory die is disposed beside the logic die.

16. A semiconductor package assembly, comprising:
a substrate having a first ground pad and a second ground pad thereon;
a memory die mounted on the substrate, wherein the memory die comprises a memory ground pad coupled to the first ground pad; a redistribution layer (RDL) structure mounted on the memory die, wherein the RDL structure
comprises:
a first RDL ground trace having a first terminal and a second terminal, wherein the first terminal is coupled to the first ground pad through a first conductive path comprising the memory ground pad, the second terminal is coupled to the second ground pad through a second conductive path that is not coupled to the does not include a memory ground pad; and a logic die mounted on the substrate, wherein the logic die comprises a logic ground pad coupled to the second terminal through the second ground pad, wherein the first ground pad is positioned along first lateral side of the memory die, and the second ground pad is positioned along a second lateral side of the memory die, and wherein the first lateral side is adjacent to the second lateral side, wherein the RDL structure further comprises a second RDL ground trace, and wherein the RDL structure further comprises at least one third RDL I/O trace between the first RDL ground trace and the second RDL ground trace.

17. The semiconductor package assembly as claimed in claim 16, wherein the first ground pad and the second ground pad are discrete ground pads, wherein the first conductive path is different from the second conductive path.

18. The semiconductor package assembly as claimed in claim 16, wherein the first terminal is located adjacent to the first ground pad and the memory ground pad.

19. The semiconductor package assembly as claimed in claim 16, wherein the second terminal is spaced from the first ground pad and the memory ground pad, wherein the second terminal is adjacent to the second ground pad.

20. The semiconductor package assembly as claimed in claim 16, wherein the memory die is located directly on the logic die.

21. The semiconductor package assembly as claimed in claim 16, wherein the memory die is disposed beside the logic die.

* * * * *

UNITED STATES PATENT AND TRADEMARK OFFICE
CERTIFICATE OF CORRECTION

PATENT NO. : 10,679,949 B2
APPLICATION NO. : 15/411077
DATED : June 9, 2020
INVENTOR(S) : Sheng-Mou Lin et al.

Page 1 of 1

It is certified that error appears in the above-identified patent and that said Letters Patent is hereby corrected as shown below:

In the Claims

Column 11, Claim 16, Line 2 should read:
a second conductive path that

Signed and Sealed this
Thirteenth Day of October, 2020

Andrei Iancu
*Director of the United States Patent and Trademark Office*